United States Patent
Zeigler et al.

(10) Patent No.: US 11,922,102 B1
(45) Date of Patent: Mar. 5, 2024

(54) METHOD TO INTEGRATE DIVERSE COMPONENTS FOR SIMULATION OF COMPLEX SYSTEM

(71) Applicant: RTSync Corp., Chandler, AZ (US)

(72) Inventors: Bernard Zeigler, Chandler, AZ (US); Doohwan Kim, Chandler, AZ (US)

(73) Assignee: RTSYNC CORP., Chandler, AZ (US)

( * ) Notice: Subject to any disclaimer, the term of this patent is extended or adjusted under 35 U.S.C. 154(b) by 0 days.

(21) Appl. No.: 18/451,904

(22) Filed: Aug. 18, 2023

(51) Int. Cl.
*G06F 30/27* (2020.01)

(52) U.S. Cl.
CPC .................................. *G06F 30/27* (2020.01)

(58) Field of Classification Search
USPC .......................................................... 703/2
See application file for complete search history.

(56) References Cited

U.S. PATENT DOCUMENTS

2018/0038669 A1* 2/2018 Hershey ............... F41H 11/02
2022/0374260 A1* 11/2022 Zhang .................. G06F 9/4843

* cited by examiner

*Primary Examiner* — Bryce M Aisaka
(74) *Attorney, Agent, or Firm* — Arch & Lake LLP

(57) ABSTRACT

The external heterogeneity in the Discrete Event System Specification (DEVS) for simulators refers to the ability to incorporate different types of models, each with potentially different behaviors, into a single simulation environment. In the DEVS framework, a system is composed of multiple individual models, each representing a component of the system. These models can be either atomic (cannot be decomposed further) or coupled (composed of other models). This gives DEVS its hierarchical nature. The atomic or coupled models can in DEVS Markov models be fundamentally different from each other. For example, one model might represent a deterministic rule-based decision process, while another model might represent a probabilistic random variable generator. These models have different state variables, different event sets, and different transition functions, but they can still interact with each other within the same simulation.

20 Claims, 10 Drawing Sheets

$$\begin{bmatrix} p_{00} & p_{01} & p_{02} & p_{03} \\ p_{10} & p_{11} & p_{12} & p_{13} \\ p_{20} & p_{21} & p_{22} & p_{23} \\ p_{30} & p_{31} & p_{32} & p_{33} \end{bmatrix}$$

$$\begin{bmatrix} \tau_{00} & \tau_{01} & \tau_{02} & \tau_{03} \\ \tau_{10} & \tau_{11} & \tau_{12} & \tau_{13} \\ \tau_{20} & \tau_{21} & \tau_{22} & \tau_{23} \\ \tau_{30} & \tau_{31} & \tau_{32} & \tau_{33} \end{bmatrix}$$

METHOD TO INTEGRATE DIVERSE COMPONENTS FOR SIMULATION OF COMPLEX SYSTEM

FIELD OF THE INVENTION

The present invention relates to integrating diverse components into Discrete Event System Specification (DEVS) models in a computer simulation.

BACKGROUND

Building simulation is increasingly more attractive to attempt to reuse existing models already built with various tools for which much effort and money has been invested. However, integrating components derived from diverse simulation modeling tools involves difficulties that stem from many sources. One primary source is the complexity arising from detailed representations of system operation in deterministic form. Existing tools are widely utilized due to their extensive capabilities to implement such details but are limited to particular domains. A method is needed to overcome such complexity that has the ability to accept and integrate probabilistic data obtained from Monte Carlo fluctuation of complex deterministic simulation models derived from domain-specific tools.

BRIEF SUMMARY OF THE INVENTION

The present invention has been made to solve at least the aforementioned problems and aims to reduce the total execution time of the simulation, thus increasing the performance of the system.

DEVS Markov modeling is a novel method that provides a sound computational foundation based on mathematical system theory for construction and composition of simulation models that can harness multiple modeling tools to create comprehensive and flexible simulation suites.

The invention is a method for system integration based on the concept of system coupling enabled by the DEVS Markov framework. This approach synergistically integrates the products of diverse modeling tools such as Systems Tool Kit (STK) and the Advanced Framework for Simulation, Integration, and Modeling (AFSIM) in a DEVS-based environment. The DEVS MARKOV method combines the time management of DEVS with the probabilistic perspective through its superior Markov modeling capabilities.

The present invention affords a new path for data-driven digital transformation in system design and optimization. It enhances the predictability and accuracy of system simulations, promotes effective decision-making, and unifies simulation models across diverse disciplines that require complex system modeling and simulation, extending beyond traditional applications.

DEVS Markov Models, as a subclass of Stochastic DEVS (Castro et al 2010), can represent complex systems at the level of individual subsystems and actors. In this guise, each system or actor can be represented as a component with states and transitions as well as inputs and outputs that enable it to interact as atomic models within coupled models using coupling in the usual way. Besides their general usefulness by integration into DEVS models, the Markov concepts of stochastic modeling are implicitly at the heart of most forms of discrete event simulation and are a natural basis for the extended and integrated Markov modeling facility. DEVS Markov models are full-fledged DEVS models and can be coupled with other DEVS components in hierarchical compositions. Due to their explicit transition and time advance structure, DEVS Markov models can be individualized with specific transition probabilities and transition times/rates which can be changed during model execution for dynamic structural change.

BRIEF DESCRIPTION OF THE DRAWINGS

Various embodiments are described below with reference to the drawings wherein:

FIG. 5 is matrices which represents the Probability Transition Structure (PTS) and Time Transition Structure (TTS);

Like reference numerals indicate similar parts throughout the figures.

DESCRIPTION OF THE PREFERRED EMBODIMENTS

Figure 1:
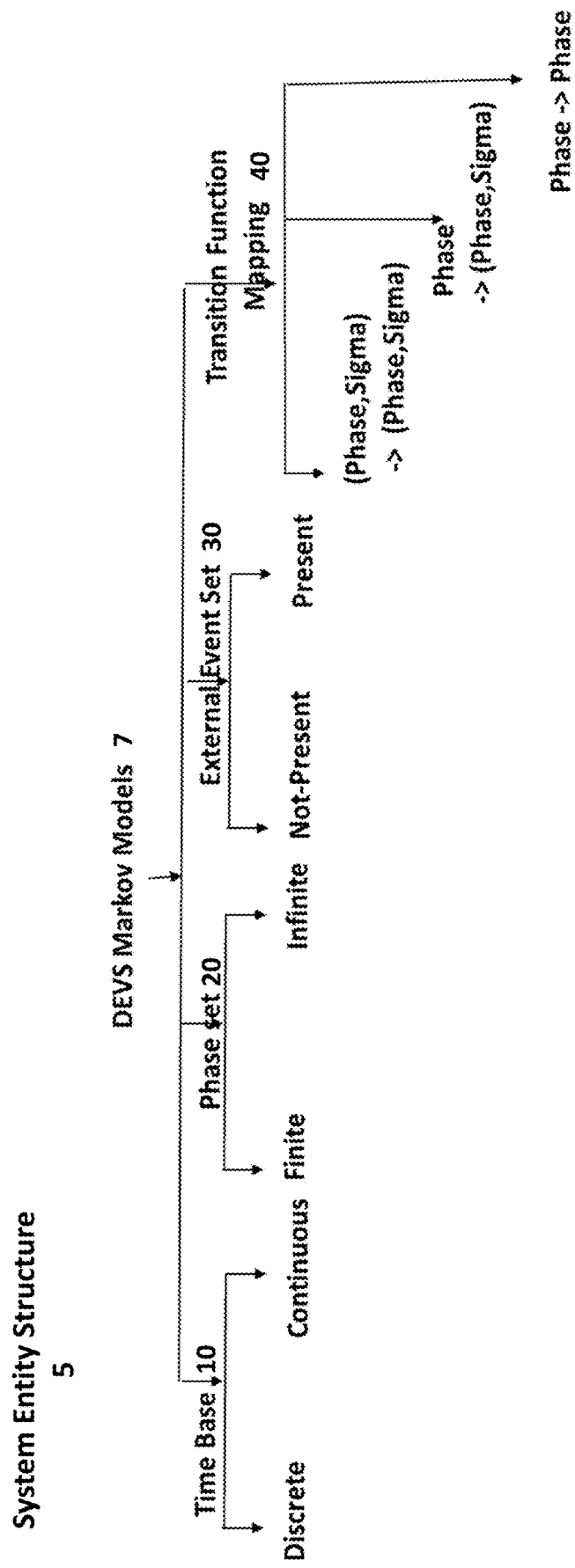
FIG. 1 is a diagram of the transition function mapping of a kernel of the DEVS Markov model.

The present disclosure may be understood more readily by reference to the following detailed description of the disclosure taken in connection with the accompanying drawing figures, which form a part of this disclosure. It is to be understood that this disclosure is not limited to the specific devices, methods, conditions or parameters described and/or shown herein, and that the terminology used herein is for the purpose of describing particular embodiments by way of example only and is not intended to be limiting of the claimed disclosure.

Also, as used in the specification and including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment. It is also understood that all spatial references, such as, for example, horizontal, vertical, top, upper, lower, bottom, left and right, are for illustrative purposes only and can be varied within the scope of the disclosure.

As shown in FIGS. 1-10, the goal of the invention is to combine algorithms, tools, software and analyses for a DEVS Markov modeling that improves upon traditional simulation of large system of system stochastic models with the objectives include: achieve speed-up and scalability as number of random draws increases; enable increased knowledge and statistical significance in scenario outcome/output distributions confidence; and minimize workload for models and simulation infrastructure for users.

The DEVS formalism is a set theory based on the set theory proposed by B. P. Zeigler (inventor) in 1976. The DEVS formalism provides a mathematical basis for modeling the discrete event system by module and hierarchical connection. The atomic model representing the system components and the coupled model that can construct a new model by combining several models can be used to represent the system hierarchically and modularly using these two types of models. This object-oriented modeling can increase the reusability, maintainability, and reliability of the model.

Discrete event system specification (DEVS) is a modeling formalism that can be used to define a behavior and structure of the system. DEVS provides a modular and hierarchical formalism for modeling and analyzing event-based systems and uses state-based specifications that can easily be translated into hardware designs. A timed sequence of events can cause changes to the state of the system—these events may be external events (e.g., generated by another model) or internal events (e.g., generated by the model itself due to a time event). The next states of the system are defined based on the previous state and the event, and the state does not change between events.

In the DEVS formalism, a model can be atomic to capture the system component behavior or building blocks of a model. Alternatively, a model can be coupled, involving the combination of and communication between different atomic models, to capture the system structure. In its classic form, the DEVS atomic model can be defined as a 7-tuple with the structure:

$$M=<S,X,Y,\delta int,\delta ext,\lambda,ta>$$

where S is the set of states, X is the set of inputs, Y is the set of outputs, δint is the internal transition function that changes the state after an internal event has occurred, δext is the external transition function that changes the state based on the arrival of an external event, λ: S→Y is the output function, and to is the time advance function. A system is initially in a start state, and each state has a time advance that dictates the amount of time spent in the state before an internal transition is triggered. Apart from positive real-valued time advance, the time advance may also be zero, offering a convenient construct for transitory states. Finally, an infinite time advance represents passive (inactive) states. An internal transition may trigger an output function whose outputs may cause external transitions on other models' input ports.

Markov Modeling is among the most commonly used forms of model expression and many classes have been studied, including Markov Chains (Feller 1966), Continuous Time Markov (CTM) Processes (Kemeny and Snell 1960), Discrete Time Markov (DTM), Semi-Markov Processes (Barbu and Limnios 2008), Probabilistic Time Automata (Kwiatkowska et al. 2011), Generalized Semi-Markov Processes (Glynn 1989; Younes and Simmons 2004), Markov Decision Processes (Rachelson, E. et al. 2008; Puterman 1994), and Hidden Markov Models (Barbu and Limnios 2008).

DEVS Markov modeling differs fundamentally from existing packages such as PRISM (Kwiatkowska et al. 2011) and SAN (Deavours and Sanders 1997) fundamental respects based on its origins in general mathematical systems theory (Zeigler, Muzy, and Kofman 2018). In brief, this means that the total state of a system which includes its sequential state and elapsed time in that state, is employed rather than the sequential state only as is the case for other simulation model formalisms. Moreover, the ability to compose in a hierarchical manner with well-defined coupling specifications is also required. Particular structures are required to integrate Markov Models into DEVS Models.

FIG. 1 is an illustration of the transition function mapping diagram of a kernel of the DEVS Markov model. Integrating Markov modeling into DEVS opens up a wide variety of model types that can be incorporated within the same framework. The mapping diagram helps to organize such models into classes that relate both to the traditional ones encountered in the mathematics and applications literature as well as to the structural features that characterize all DEVS models as specifications of input/output dynamic systems. In the following, the embodiment employs a System Entity Structure 5 to provide such an organization. The mapping diagram shows a DEVS Markov model specification 7 as composed of a time base 10, phase set external event set 30, and transition function 40 mapping with specializations for each component. Classes and sub-classes of such models then can be formed by choice of elements within some specializations, perhaps leaving others unspecified. The broader the class, the fewer elements of the SES are fixed. Conversely, the narrower the class, the greater is the number of selections made. The specific items are addressed as follows.

Time Base 10—can be discrete or continuous. Most of our concentration will be on continuous time but simplifying properties of discrete time make it useful at times.

Phase Set 20—this is the state set typically referred to in math expositions. The reason the embodiment refers to it as the phase set is that the state of a DEVS will include sigma, the explicit representation of the time advance. In addition, the global state of DEVS includes the elapsed time. The embodiments focus mostly on finite phase (Markov state) sets, however, much of the approach will extend to infinite state sets.

External Event Set 30—this is the external interface including the input and output sets. Sometimes, it is convenient to consider only the transition portion of the DEVS structure, which omits the external event set related elements, and will be called the core of the structure. On the other hand, the external interface is needed for including model types such as hidden Markov and Markov Decision Processes that interact with the environment and other agents.

Transition Function Mapping 40—can be used to help understand the differences in the varieties of Markov models in the literature, e.g., semi-Markov, GSMP (Nielsen 1998), hidden Markov, etc. The kernel of the Markov implementation in DEVS is the Transition Function Mapping. The phase and sigma play the roles of Markov state and transition time, respectively. At every internal transition the current phase and sigma together with a random number select a next phase and sigma.

Figure 2:
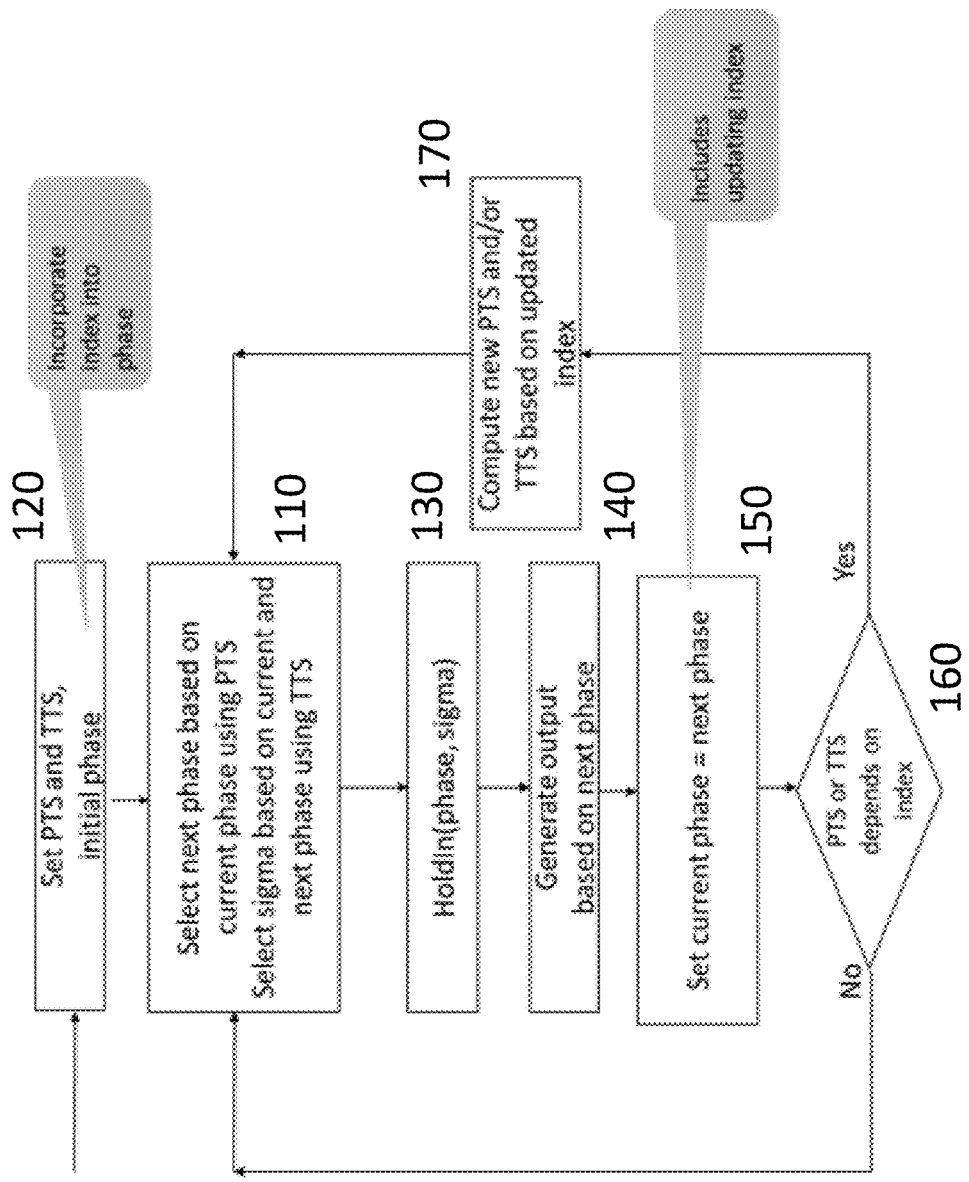
FIG. 2 is an illustration of a flow diagram of a basic interpretation of a Probability Transition Structure (PTS) in a Markov chain.

The flow chart in FIG. 2 illustrates the control flow for the internal transitions for an atomic DEVS Markov model based on a pair of Probability Transition Structure (PTS) and Time Transition Structure (TTS). The first step 120 is to set PTS and TTS and initial phase. The first step 120 incorporates an index into the phase. The second step 110 is to select phase based on current phase using PTS from the first step 120 and to select sigma based on current and next phase using TTS from the first step 120. The third step 130 is holding in the selected phase and sigma which sets the phase to one specified after the time sigma has elapsed. The fourth step 140 is to generate output based on the next phase. The fifth step 150 is to set the current phase based on the next phase which is generated from the fourth step 140. The fifth step includes updating the index. The sixth step 160 is to decide if there is a match with the PTS or the TTS depending on the index. If there is a match with PTS or TTS, the next step 170 to compute a new PTS and/or TTS based on an updated index, and then next step goes to the second step and repeats the steps. If there is no match with PTS or TTS, the next step goes to the second step and then repeats the steps.

Figure 3B:
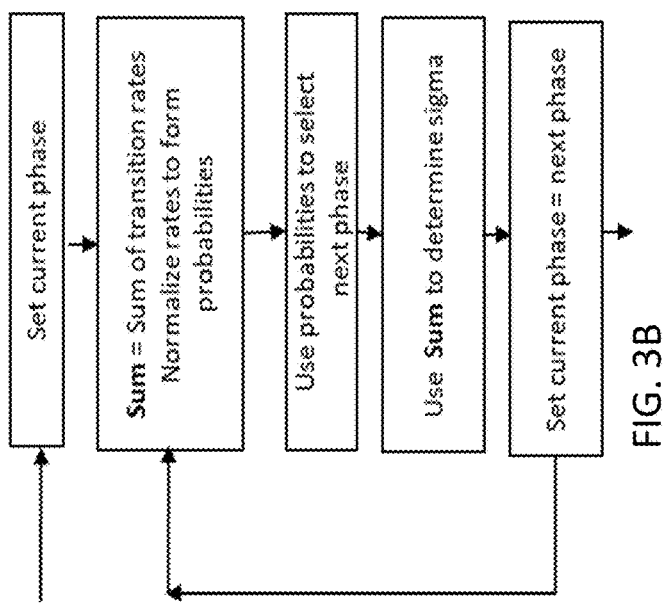
FIGS. 3a and 3b are diagrams illustrating a continuous time base and a transition specification according to the present disclosure.
Figure 3A:
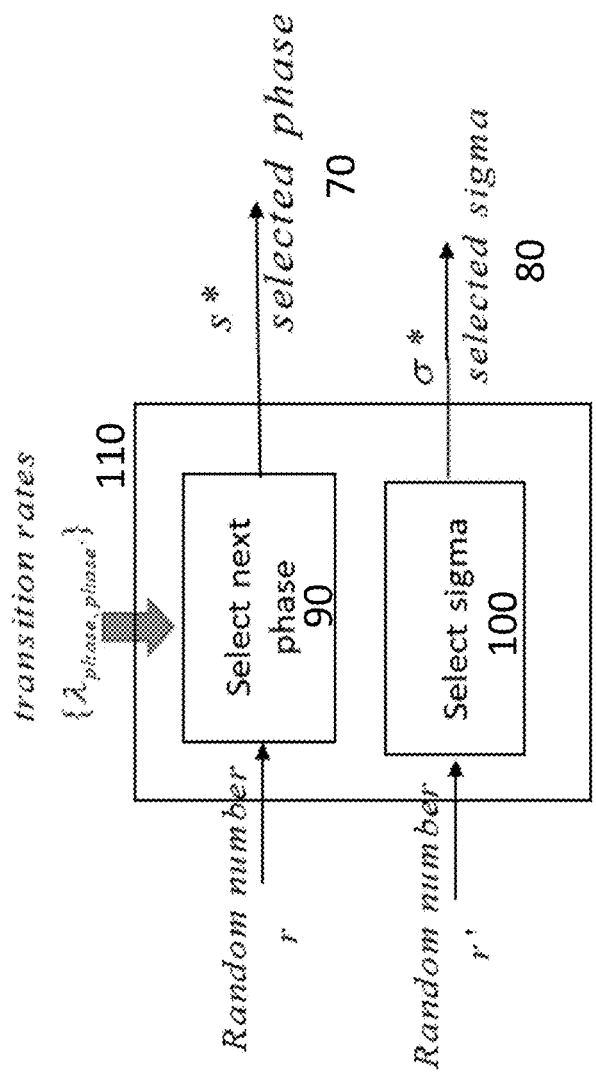

Subclasses of Markov models can be characterized by pruning operations on the overall SES. The DEVS Semi-Markov model employs the most flexible transition mechanism which uses the current phase and sigma to select the next phase and sigma. When composed into coupled models such models include the Generalized Sequential Markov Process (GSMP). For example, the Discrete Time Markov (DTM) model class is generated where the time base is discrete with finite state set. The transition specification employs transitions from phases to phases which take a fixed time step also called a cycle length. In contrast the Continuous Time Markov (CTM) employs a continuous time base and a transition specification that employs only the current phase to determine both the next phase and the transition time as shown in FIGS. 3a and 3b. It can do so because the transition probabilities are interpreted as rates in exponential distributions for transition times. That is all transition times are based on the same type of distribution (exponential) while in the more general case, a time distribution can be associated with each non-self-transition pair (phase, phase').

The external heterogeneity in the DEVS for simulators refers to the ability to incorporate different types of models, each with potentially different behaviors, into a single simulation environment.

In the DEVS framework, a system is composed of multiple individual models, each representing a component of the system. These models can be either atomic (cannot be decomposed further) or coupled (composed of other models). This gives DEVS its hierarchical nature.

In the extended DEVS Markov external heterogeneity comes in when it is noted that these atomic or coupled models can be fundamentally different from each other. For example, one model might represent a deterministic rule-based decision process, while another model might represent a probabilistic random variable generator. These models have different state variables, different event sets, and different transition functions, but they can still interact with each other within the same simulation.

This characteristic makes DEVS MARKOV a very flexible method to integrate diverse components for simulation of complex systems. It can be used to model a wide variety of systems, from manufacturing processes to computer networks, and everything in between. It also allows for the integration of models developed independently, which can significantly reduce development time and increase reusability.

The invention introduces two probabilistic structures that will provide the basis for specifying the DEVS Markov formalism that formalizes the Transition Function Mapping 40 of FIG. 1. First, this embodiment defines a Probability Transition Structure (PTS) in set-theoretic form to be given in a moment. It often takes on the familiar form of a matrix of probability values. For example, the matrix $$\begin{bmatrix} p_{00} & p_{01} \\ p_{10} & p_{11} \end{bmatrix}$$

is represented by the structure: $<\{0,1\}, Pr>$ where $Pr: \{0,1\}\times\{0,1\}\to[0,1]$ such that $Pr(i,j)=p_{ij}$. Formally, a Probability Transition Structure is a structure $PTS=<S,Pr>$ where $Pr: S\times S\to[0,1]$ and $Pr(s,s')=v$, $0\le v\le 1$. As a relation Pr contains triples of the form (s,s',v) which stands for state s transitions to state s' with probability v. For each $s\in S$, define the restriction of Pr to s, $Pr|s: S\to[0,1]$ defined by $Pr|s(s')=Pr(s,s')$. Then Pr is subject to the constraint that it is fully defined (every transition has a probability) and the probabilities of transitions out of every state sum to 1. That is, for each $s\in S$, $$\sum_{s'\in S} Pr|s(s') = 1$$

The set-theoretic representation of the usual matrix supports manipulations equivalent to data structure operations that render it more convenient to create and manage derived DEVS models.

The basic interpretation of a Probability Transition Structure (PTS) is of a Markov chain, i.e., a set of states that generate sequences determined by the probability structure. The probabilities of the ensemble of all such state sequences can be described by a vector representing probabilities of being in the states and iterative application of the associated matrix. In a very abbreviated summary of Markov chain theory (Dayar 2013; Banisch 2015), the embodiment has the state vector in equilibrium reached at step n* is defined by $p(n+1)=p(n)$, for all $n>n^*$ which implies that $p(n^*) P=p(n^*)$ and $p^*=p(n^*)$ is the equilibrium vector where a unique solution exists.

The second structure to be introduced allows the embodiment to work with the times of the transitions. These can be referred to variously and equivalently as sojourn times, transition times, time advances, elapsed times, or residence times depending on the context.

Time Transition Structure: $TTS=<S,\tau>$ where $\tau: S\times S\to ProbabilityDensityFunctions$ such that the time for transition from s to s' is selected from $\tau(s,s'): R_{0,\infty}^+\to[0,1]$.

$$\begin{bmatrix} \tau_{00} & \tau_{01} \\ \tau_{10} & \tau_{11} \end{bmatrix}$$

is represented by the structure: $<\{0,1\}, \tau>$ where $\tau: \{0,1\}\times\{0,1\}\to[0,1]$ such that $\tau(i,j)=\tau_{ij}$ and $\tau_{ij}$ is a pdf (probability density function) $\tau: R_{0,\infty}^+\to[0,1]$. For example, $\tau_{ij}(t)=e^{-t}$ represents the exponential pdf for selecting a time for transition from i to j.

The pair (PTS, TTS) specifies a DEVS Markov core as follows:

Probability Transition Structure: $PTS=<S,Pr>$ and Time Transition Structure: $TTS=<S,\tau>$ gives rise to a DEVS Markov Core $M_{DEVS}=<S_{DEVS},\delta_{int},ta>$ where $S_{DEVS}=S\times[0,1]^S\times[0,1]^S$ with typical element $(s,\gamma_1,\gamma_2)$ with $\gamma_i:S\to[0,1]$, i=1, 2 where $\delta_{int}:S_{DEVS}\to S_{DEVS}$ is given by: $s'=\delta_{int}(s,\gamma_1,\gamma_2)=(SelectPhase_{PTS}(s,\gamma_1),\gamma_1',\gamma_2')$ and ta: $S_{DEVS}\to R_{0,\infty}^+$ is given by: $ta(s,\gamma_1,\gamma_2)=SelectSigma_{TTS}(s',\gamma_2)$ where note that s' is a function of s, and $\gamma_i'=\Gamma(\gamma_i)$, i=1, 2.

Figure 4:
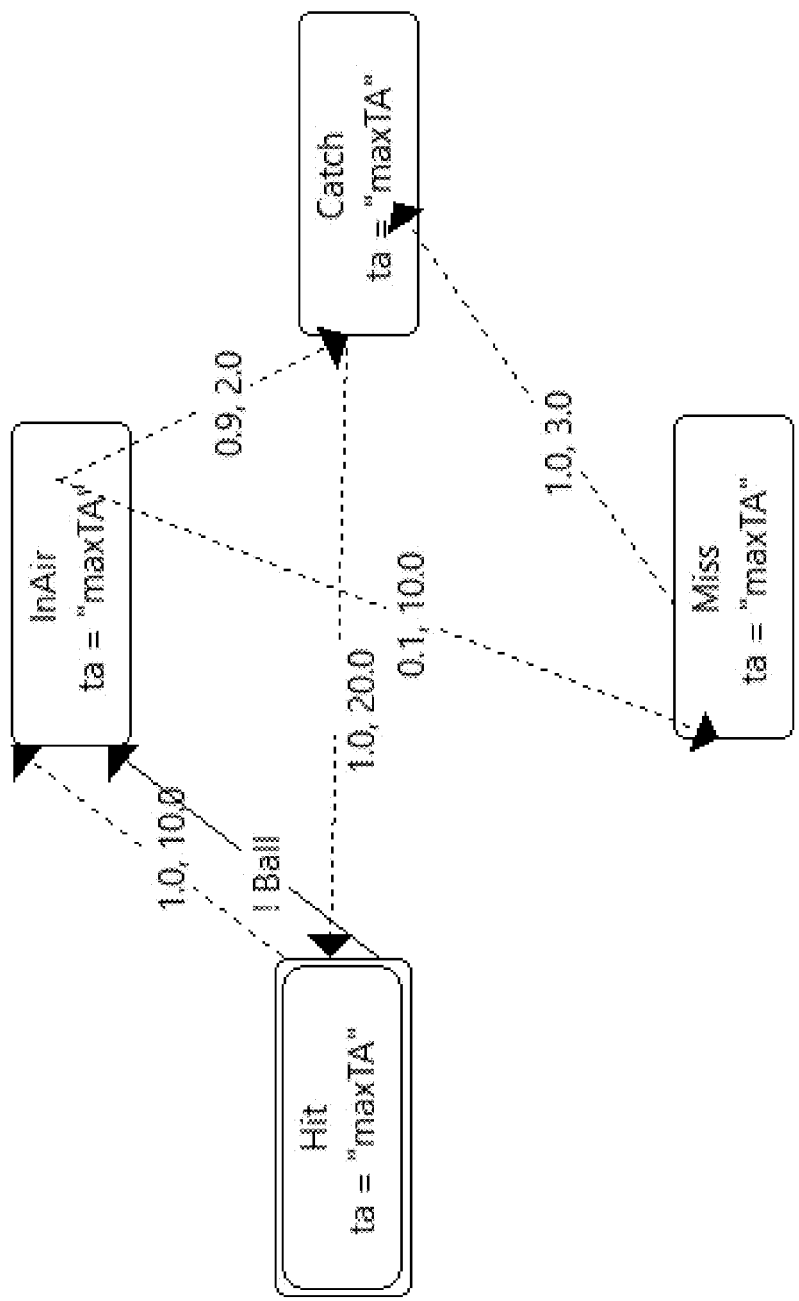
FIG. 4 is modeling a fielder having a probability of catching or fumbling a ball in a baseball game.

As another embodiment, the situation depicted in FIG. 4 in which a fielder has a probability of catching or fumbling a ball is considered. In contrast to the Continuous Time Markov (CTM) approach depicted in the time base 10, using DEVS Markov formulation, the embodiment can separately account for the probability of one or the other eventuality as well as the times taken in each case. Let the phases be coded by integers as follows: Hit=0, InAir=1, Catch=2, Miss=3. Then the PTS and TTS can be represented by matrices as shown FIG. 5.

The non-zero probability elements are: $p_{01}=1$, $p_{12}=0.1$, $p_{13}=0.9$, $p_{20}=1$, $p_{32}=1$. Note that a transition that is the only one outgoing from a phase gets a probability of 1. Now let the elements of the TTS be pdfs defined by exponential distributions for transition times with mean values as follows: $\tau_{01}$mean=1, $\tau_{12}$mean=2, $\tau_{13}$mean=10, $\tau_{20}$mean=20, $\tau_{32}$mean=3. With time units as seconds, these values assert that the ball is in the air for one sec., and if it is caught it takes 10 sec. to recover and be in a position to return it to the catcher. Using exponential pdfs the embodiment needs only specify these values as parameters while other distributions might require specifying more parameters.

The conversion of the pair (PTS,TTS) into a DEVS Markov Core model is the formal equivalent of the flow chart in FIG. 2. The box at 110 shows that to make a transition, first the function at 90 randomly selects a next phase based on PTS which specifies a transition pair. The function at 100 then randomly selects a sigma for the time of this transition. The random selections are performed by the functions SelectPhase 70 and SelectSigma 80, respectively in FIG. 3A.

Figure 6A:
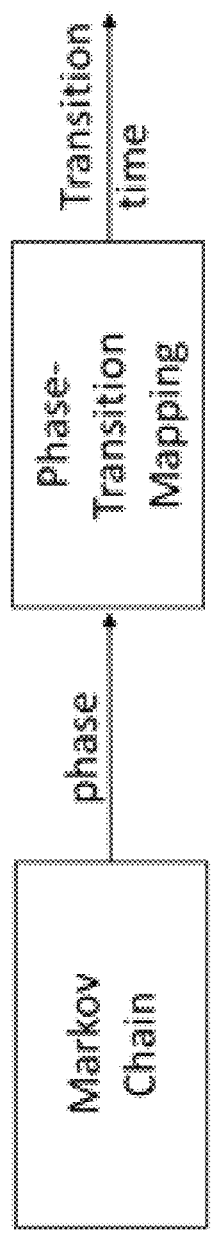
FIGS. 6A and 6B are an illustration of a sequential dependence of transition time selection on probability selection and its evolution over time.
Figure 6B:
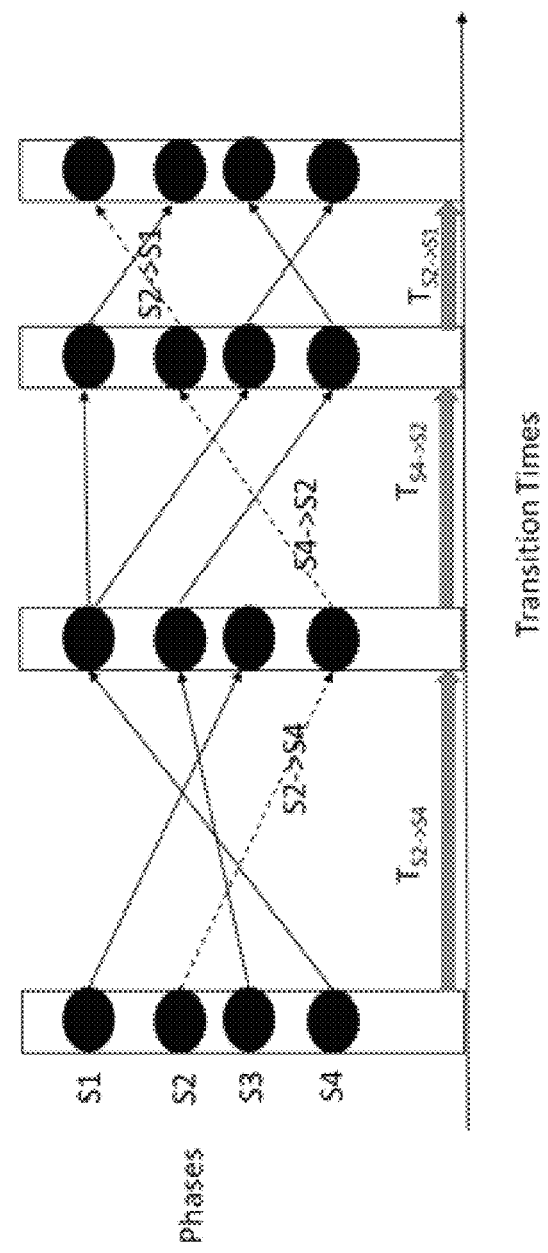

The sequential dependence of transition time selection on probability selection and its evolution over time are illustrated in FIGS. 6A and 6B respectively. A state trajectory can be visualized as starting in an initial phase such as S2, and advancing with variable time steps determined by the successive states. For example, the transition from S2 to S4 is selected based on transition probabilities out of S2 and then the transition time $T_{S2 \to S4}$ is selected from its distribution. This sequential dependence allows the invention to use the representation in FIG. 6A where the successive selection of probabilities is considered as a Markov chain as front component with the time advance mapping as back component. Thus, if the invention is only interested in the probabilities of states at transitions (and not in the timing of the transitions) then the embodiment can consult the Markov chain interpretation of the PTS, in particular for an ergodic chain, the steady state probabilities can be computed using the Markov Matrix model. Having these probabilities, the invention can then compute the expected sojourn times using the TTS distributions.

The disclosed method to integrate diverse components for simulation of complex systems employs the DEVS MARKOV framework as the unifying medium between heterogeneously developed models from various tools. Within DEVS MARKOV, models developed in various tools, are treated as distinct atomic or coupled models, each with its state transitions, inputs, and outputs. This approach ensures the preservation of each simulator's unique characteristics, whether high-precision or broader-stroke, and allows for their coordination and interaction.

At the heart of this strategy is the semantic ontological System Entity Structure (SES). As a repository for high-level constituent information, it enables incremental optimization and facilitates the establishment of meaningful relationships between diverse data points. This fosters an in-depth understanding of system dynamics and aids in data-driven decision-making. This approach enables continuous refinement of models and promotes informed, proactive decision-making based on accurate simulation results.

The software environment helps to provide some essential background for the design and implementation of the DEVS Markov modeling and simulation. The software has an environment to design general systems as well as Systems of Systems (SoS) based on DEVS modeling and simulation theory. The software supports collaboration of domain experts and modelers in both top down and bottom up system construction. To do so, it provides tools such as the state diagram designer, sequence diagrammer, and System Entity Structure (SES) pruning GUI, to generate DEVS atomic and coupled models. Top down design can start with an SES which describes the overall system as a tree structure, which comprises entities (which refer to components of the system) with relations (such as decomposition, specialization, and multi-aspect). To generate a specific coupled model (one instance from the SES), a pruning process (tailoring the system) needs to be done with a script containing pruning information. After transformation, entities become either atomic models (leaf nodes) or coupled models (middle nodes) recreated from existing Java classes. For bottom up design, atomic models are first developed and then the whole system is constructed with an SES. In this process, modelers can use a customized text editor to express atomic models using the DEVS Natural Language (DNL), a restricted form of natural language. Alternatively, the state diagram designer supports graphical specification of atomic models. Eventually, the state diagram is automatically (and reversibly) converted to a DNL file and a Java atomic model class is compiled to execute in the software execution environment. Of course, alternation between top down and bottom up processes and iteration of elements in the workflow are also encouraged.

The DNL (DEVS Natural Language) focuses on the description of the DEVS model structure but also includes program language specific information in a structured modular manner. An atomic DEVS model can be constructed within natural language for DEVS constructs such as time advance for each state, input/output ports, state transitions, internal transitions, external transitions, and output specification. However, a model expressed with limited natural language cannot specify a function's detailed behavior. To overcome this problem, the DNL file introduces tag blocks which enclose actual computer code to be inserted in specific locations within the Java class file, e.g., within the characteristic functions of the DEVS Java model. Thus, the tag blocks allow a DNL file to include programming specific information so as to enjoy full computer language expressive power.

The software supports several types of DEVS atomic models which can be constructed with a state diagram to help users visualize states and transitions comprising the model. A normal DNL file is converted to general DEVS Java Model which contains required variables and functions for the DEVS formalism, together with users' added variables and functions. The State Designer enables state transitions for a general DEVS model to be characterized using the designations of Input Port, Output Port, No Output, and Probability as described in Table 1.

TABLE 1

State Designer User Specifications of Transition Types

| Type | User Specifies | Effect |
| --- | --- | --- |
| Input Port | name and type of message received | Enables an external event tag block for code handling of the messages received to implement the transition |
| Output Port | name and type of message generated | Enables an output event tag block for code generating the messages |
| No Output | N/A | Enables an internal event tag block for code implementing the transition |
| Probability | Probability of transition | Described in the next paragraph [0063] |

The Probability type is used to dynamically pick the next state among successor states with specified probabilities for DEVS Markov models. In addition to having an input field to enter a probability value, the Probability type works similarly to the No Output type in that it enables an internal event tag block for code to implement the actions associated with the transition (Seo et al. 2015)).

Figure 7:
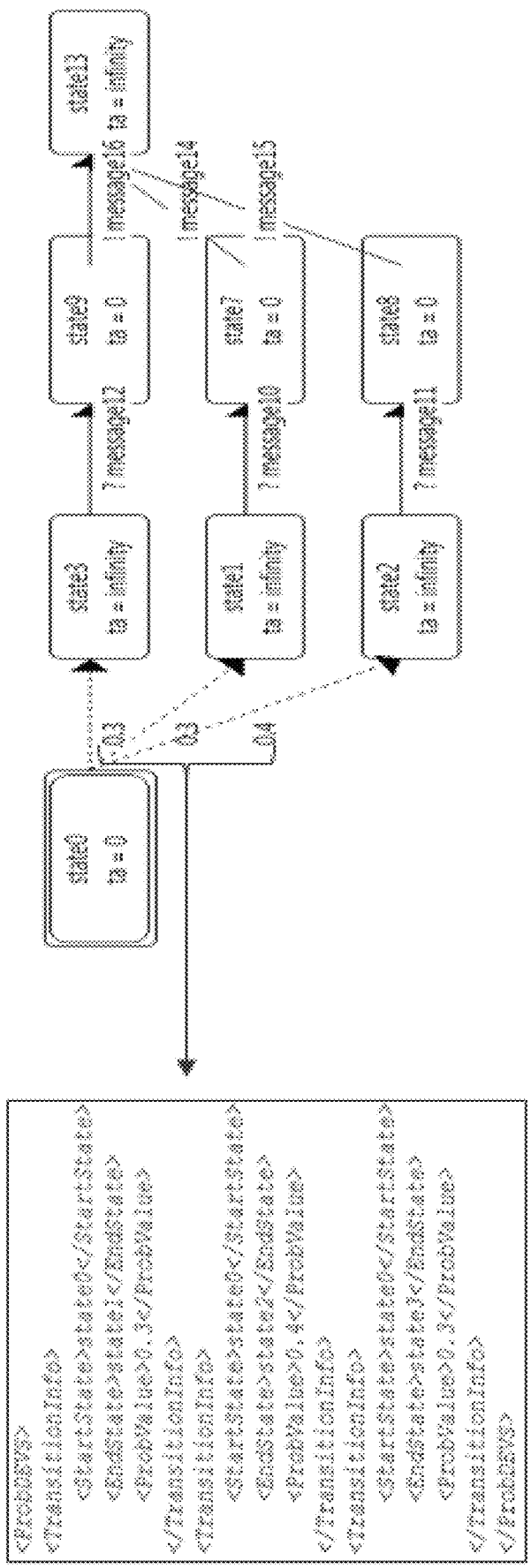
FIG. 7 is a state diagram for Finite Probability DEVS (FPDEVS) and XML document containing Probability type transitions' information.

The state diagram displays a different (dotted) line for a Probability type to distinguish it from other transition types (solid lines). Likewise, the DNL file needs to have two capabilities such as saving probability values for transitions and implementing a random selection for probability transitions. To preserve the probability values for transitions in a DNL file, the tag block in the internal transition function includes an XML document (FIG. 7.) The document describes triples of the form (start state, end state, and probability value). To select a next state from such a specification, a function called internal TransitionForDEVS-Markov is placed in the tag block and defined in an additional code section in which customized function definitions can be inserted. The function is called in the internal transition function if the current state has Probability type transitions.

The TransitionInfo tag shows each Probability type Transition whose information comprises start state, end state, and probability value recorded in StartState, EndState, and ProbValue tags, respectively.

FIG. 7 illustrates a state diagram for DEVS Markov and XML document containing Probability type transitions' information. Three dotted lines with probability values represent Probability type transitions from the state( ). Solid lines show normal transition lines with question marks(?) and exclamation marks(!) before port names. The question mark is for an Input Port transition, and the exclamation mark for an Output Port transition. A shape having two rectangles represents the initial state in the state diagram. A state displays the name of the state and time advance (ta). The state diagram is converted to a DNL file which can later be restored in the state designer. For this purpose, the DNL file contains information of DEVS Markov, especially Probability transition information in an associated XML document. The entries in the associated tags are used to construct Probability type transitions for the selected DNL file in the state diagram.

Figure 8:
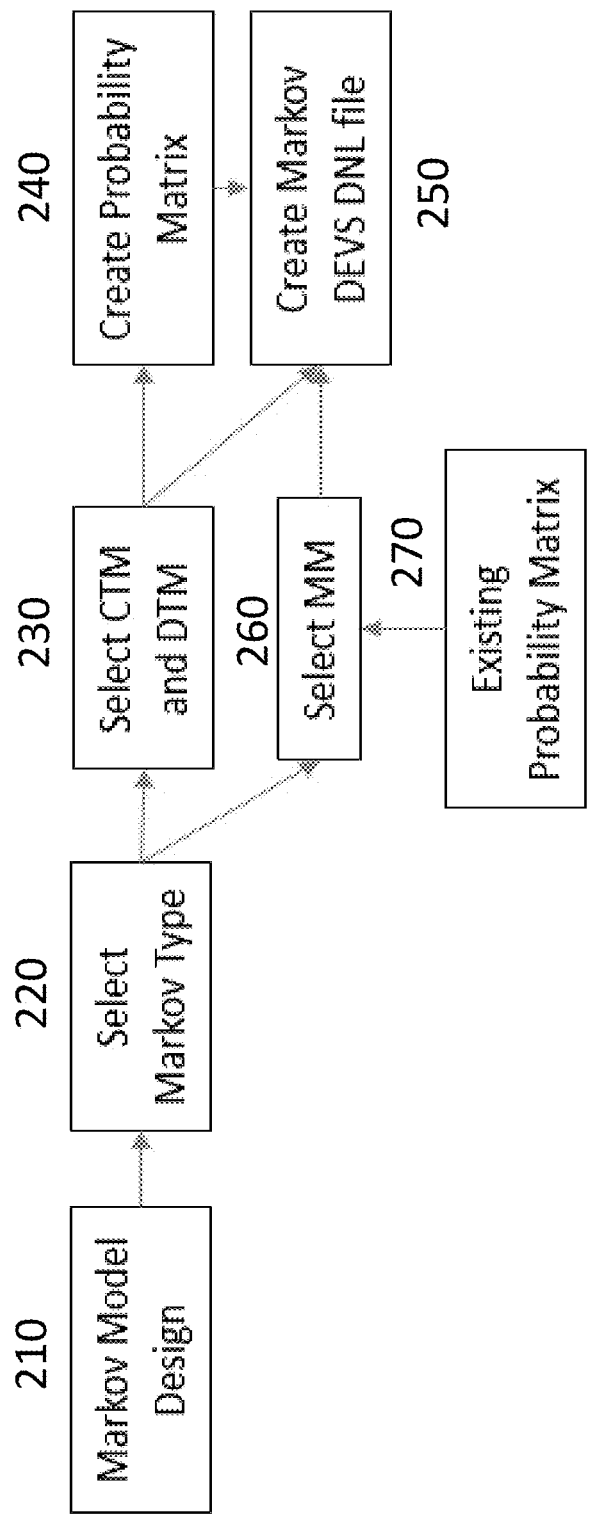
FIG. 8 is an illustration of how to create three types of Markov DEVS models using the state designer.

To implement into a software program, the invention proceeds to describe how the state designer can be extended to support construction of the basic Markov model types such as Continuous Time Markov (CTM), Discrete Time Markov (DTM), and Markov Matrix (MM). A Markov model is designed with Probability type transitions in the state diagram. A probability matrix from the Markov model is a key piece of information to execute the model in the software environment. Each Markov type DEVS model has its own additional required variables, codes, and functions to execute its behaviors. For example, a CTM model decides its next state using probability values and sojourning time of the next state using a default or assigned distribution function. A DTM uses a fixed sojourning time for the current state, and a MM utilizes the probability matrix 270 to calculate the equilibrium state vector. In contrast to a normal DEVS model, the Markov design in the state diagram is transformed to an XML document and a DNL file. FIG. 8 illustrates how to create three Markov DEVS models using the state designer. To generate a CTM or DTM model, users first construct a Markov transition model in the state diagram 210. The users select Markov Type 220. Then on the first time through the process, they select Continuous Time Markov or Discrete Time Markov in the Create Markov Model dialog window 230. The Markov state designer generates an XML document which contains Probability type information 240, and a DNL file with supporting variables, codes, and functions for a CTM or DTM DEVS model. Subsequent modifications of the models only require incremental inputs which are saved to the created files. However, if a probability matrix exists in an XML file 270, the user selects Markov Matrix (MM) 260, the users can create a Markov Matrix model using it with the Create Markov Model dialog window 250.

Figure 9:
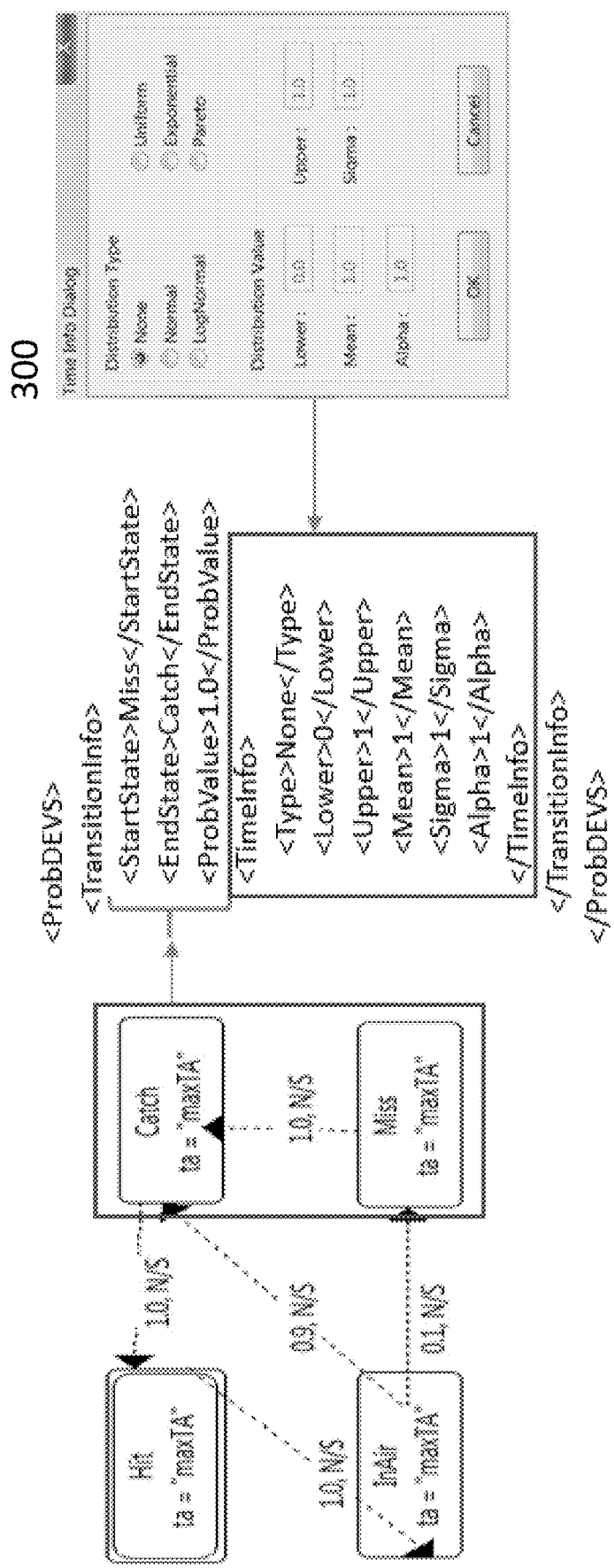
FIG. 9 is illustrating how information in a TransitionInfo tag is created from the state diagram.

Another embodiment shows how transition time information is added for a general DEVS Markov model as shown in FIG. 9. A GUI to set time information for each transition is added to enable users' specification of transition time distribution functions. See, Semi-Markov models allow distributions other than exponential and geometric even though these are not necessarily memoryless (Barbu and Limnios 2008.)

FIG. 9 shows how information in a TransitionInfo tag is created from the state diagram. The transition displays a probability value and adds as additional information the mean value of the distribution function assigned by the user. The state diagram provides a Time Info Dialog window 300 as seen on the right side of FIG. 9 to select five distribution functions with the None type as a default. (Showing a transition line with N/S (Not Specified)). Each distribution function needs to have one or more parameters. For example, the Uniform distribution function requires upper and lower bounds as parameters, and Exponential distribution function requires only a mean value. The Time Info Dialog enables entry of parameter value(s) by selecting a distribution function type. The XML document is parsed to generate a list of TransitionInfo instances in the ContinuousTimeMarkov class which contains utility functions to perform the functions described in Markov Chain.

The software provides three packages to support Markov DEVS models. The ContinuousTimeMarkov class contains instances of other classes in the com.ms4systems.devs.markov package to hold all transition information and associated time information from an XML document. The TransitionInfo class has an instance of the SampleFromDistribution class which is a super class for all classes in the com.ms4systems.devs.analytics package. Based on a distribution type in a TimeInfo class, the TransitionInfo class can have instances of the five distribution types. For example, if a TimeInfo class has a Normal distribution type, the TransitionInfo class generates the instance of the SampleFromNormal class with the mean value from the TimeInfo instance. Each distribution class has a function to generate a random value which is used for transition time to a next state. If None distribution type is selected, the SampleFromExponential class is used as a default. The TimeInState class accumulates residence time in each state during simulation runs. The MarkovMat class is used in DEVS Markov Matrix models to calculate probability matrices.

DEVS Markov models have functions to help execute each Markov type. A CTM DEVS model uses an internalTransitionForMarkov function to sample the next state and transition time. The function is called whenever internal events occur in the CTM model. A DTM DEVS model has an internalTransitionForDiscreteMarkov function to compute a next state whenever internal transitions are triggered in the DTM DEVS model. In Markov Matrix, the internalTransitionForMatrix function is executed at each internal event.

Figure 10:
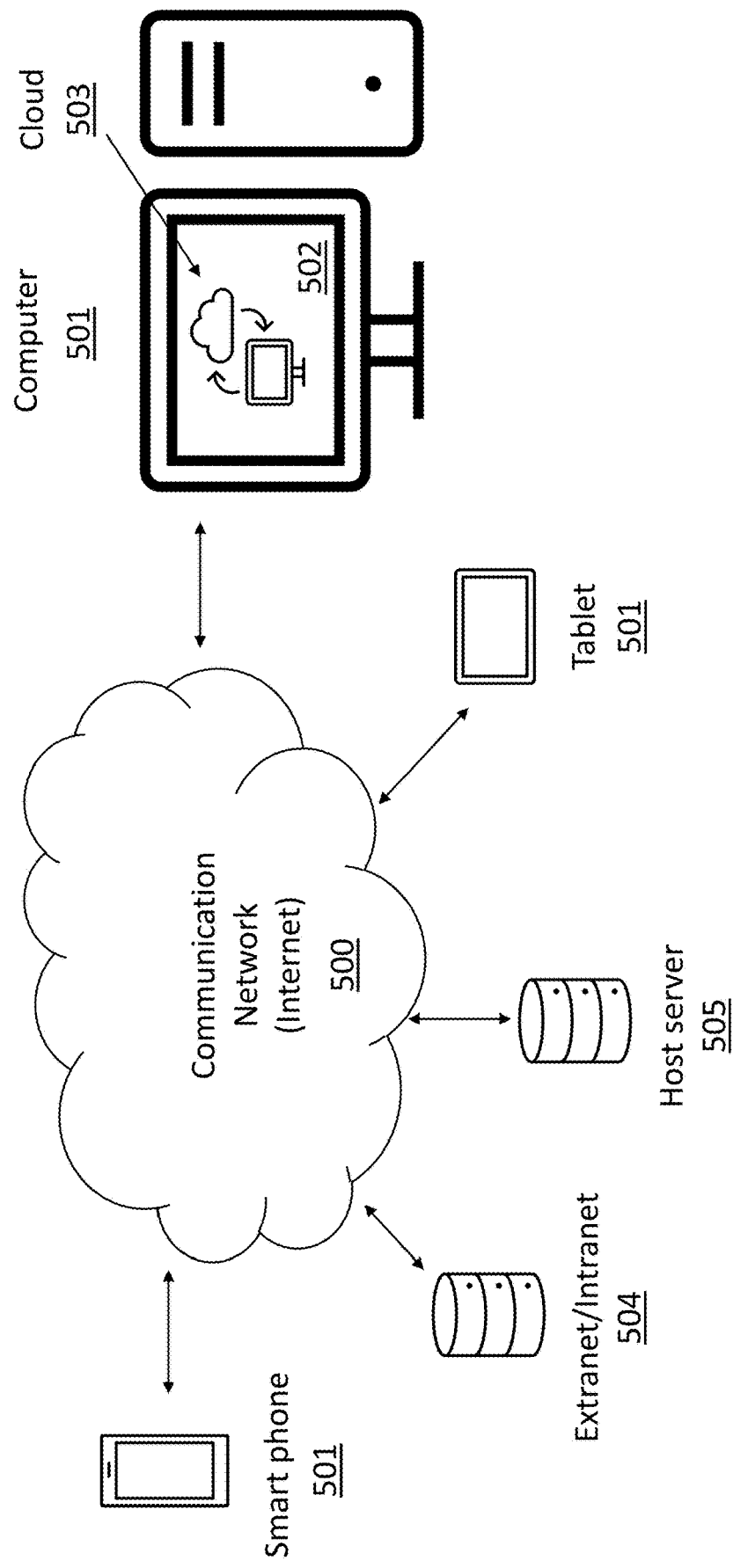
FIG. 10 illustrates a computer wirelessly downloaded a program product including a non-transitory machine-readable program code for DEVS Markov chips.

FIG. 10, the system of the present invention may include at least one computer 501 with a user interface. The computer may include any computer including, but not limited to, a desktop, laptop, and smart device, such as, a tablet and smart phone. The computer 501 includes a computer software program product including a non-transitory machine-readable program code for causing, when executed, the computer to perform steps. The program product may include software which may either be loaded onto the computer or accessed by the computer. The loaded software may include an application on a smart device. The software may be accessed by computer using a web browser 502. The computer may access the software via the web browser using the internet 500, extranet, intranet 504, host server 505, internet cloud 503 and the like.

The computer-based data processing system and method described above is for purposes of example only and may be implemented in any type of computer system or programming or processing environment, or in a computer program, alone or in conjunction with hardware. The present invention may also be implemented in software stored on a non-transitory computer-readable medium and executed as a computer program on a general purpose or special purpose computer. For clarity, only those aspects of the system germane to the invention are described, and product details well known in the art are omitted. For the same reason, the computer hardware is not described in further detail. It should thus be understood that the invention is not limited to any specific computer language, program, or computer. It is further contemplated that the present invention may be run on a stand-alone computer system or may be run from a server computer system that can be accessed by a plurality of client computer systems interconnected over an intranet network, or that is accessible to clients over the Internet. In addition, many embodiments of the present invention have application to a wide range of industries. To the extent the present application discloses a system, the method implemented by that system, as well as software stored on a computer-readable medium and executed as a computer program to perform the method on a general purpose or special purpose computer, are within the scope of the present invention. Further, to the extent the present application discloses a method, a system of apparatuses configured to implement the method are within the scope of the present invention.

While the above description contains many specifics, these specifics should not be construed as limitations of the invention, but merely as exemplifications of preferred embodiments thereof. Those skilled in the art will envision many other embodiments within the scope and spirit of the invention as defined by the claims appended hereto.

Where this application has listed the steps of a method or procedure in a specific order, it may be possible, or even expedient in certain circumstances, to change the order in which some steps are performed, and it is intended that the particular steps of the method or procedure claim set forth herein below not be construed as being order-specific unless such order specificity is expressly stated in the claim.

While the preferred embodiments of the devices and methods have been described in reference to the environment in which they were developed, they are merely illustrative of the principles of the inventions. Modification or combinations of the above-described assemblies, other embodiments, configurations, and methods for carrying out the invention, and variations of aspects of the invention that are obvious to those of skill in the art are intended to be within the scope of the claims.

What is claimed is:

1. A method for a DEVS (Discrete Event System Specification) Markov model in a simulation system, comprising:
   combining a time management of the DEVS model with a probability character of the Markov model;
   integrating a Markov model into a DEVS model, wherein the Markov model and the DEVS model has stochastic characters, and the DEVS Markov model is the integration of the Markov model and the DEVS model;
   organizing DEVS Markov Model classes using a system entity structure, wherein the DEVS Markov model has classes and/or subclasses;
   integrating components of diverse modeling tools into a DEVS Markov model using the DEVS Markov Model classes.

2. The method of claim 1, further comprising considering the diverse modeling tools as a distinct atomic or a coupled model in the DEVS Markov model.

3. The method of claim 2, wherein the atomic or the coupled model has state transition, inputs, and outputs.

4. The method of claim 3, wherein the state transition comprises a start state, and an end state, and a probability value recorded in the start state and the end state.

5. The method of claim 2, wherein the atomic or the coupled model is different from each other depending on state variables, event sets, or transition function.

6. The method of claim 2, wherein the atomic or the coupled model incorporates different types of models with different behaviors into a single simulation system.

7. The method of claim 1, wherein the DEVS Markov Model classes and/or subclasses are a time base, phase set, external event set, and transition function.

8. The method of claim 7, further comprising mapping the transition function with specializations for the components.

9. The method of claim 8, wherein the component is an individual model in DEVS Markov Model.

10. The method of claim 1, wherein, when the classes are broader, the fewer elements of the system entity structure are fixed, and when the classes are narrower, the greater number of selections made.

11. A system for a DEVS (Discrete Event System Specification) Markov model in a simulation system, comprising:
   a processor configured to:
      combine a time management of the DEVS model with a probability character of the Markov model;
      integrate a Markov model into a DEVS model, wherein the Markov model and the DEVS model has stochastic characters, and the DEVS Markov model is the integration of the Markov model and the DEVS model;

organize DEVS Markov Model classes using a system entity structure, wherein the DEVS Markov model classes has classes and/or subclasses in the DEVS Markov model;

integrate components of diverse modeling tools into a DEVS Markov model using the DEVS Markov Model classes.

12. The system of claim 11, further comprising a consideration unit considering the diverse modeling tools as a distinct atomic or a coupled model in the DEVS Markov model.

13. The system of claim 12, wherein the atomic or the coupled model has state transition, inputs, and outputs.

14. The system of claim 13, wherein the state transition comprises a start state, and an end state, and a probability value recorded in the start state and the end state.

15. The system of claim 12, wherein the atomic or the coupled model is different from each other depending on state variables, event sets, or transition function.

16. The system of claim 12, wherein the atomic or the coupled model incorporates different types of models with different behaviors into a single simulation system.

17. The system of claim 11, wherein the DEVS Markov Model classes and/or subclasses are a time base, phase set, external event set, and transition function.

18. The system of claim 17, further comprising a mapping unit mapping the transition function with specializations for the components.

19. The system of claim 18, wherein the component is an individual model in DEVS Markov Model.

20. The system of claim 11, wherein, when the classes are broader, the fewer elements of the system entity structure are fixed, and when the classes are narrower, the greater number of selections made.

* * * * *